United States Patent [19]

Olson et al.

[11] Patent Number: 5,381,585
[45] Date of Patent: Jan. 17, 1995

[54] DOCKING HANDLE

[75] Inventors: David P. Olson, Tempe; Ed K. Tafoya; Craig C. Staab, both of Mesa, all of Ariz.

[73] Assignee: VLSI Technology, Inc., San Jose, Calif.

[21] Appl. No.: 96,589

[22] Filed: Jul. 23, 1993

[51] Int. Cl.[6] .......................... E05B 1/00; E05B 7/00
[52] U.S. Cl. .................................................. 16/112
[58] Field of Search ............... 16/112, 110 R, 111 R, 16/116 R; 324/158.1

[56] References Cited

U.S. PATENT DOCUMENTS

| | | |
|---|---|---|
| 4,378,139 | 3/1983 | Griffin et al. . |
| 4,429,275 | 1/1984 | Cedrone ................ 324/158 F |
| 4,961,354 | 10/1990 | Yoshigai ................ 16/112 |
| 4,984,997 | 1/1991 | Korsunsky et al. ..... 324/158.1 |
| 5,060,343 | 10/1991 | Nisenbaum ............. 16/111 R |

Primary Examiner—P. Austin Bradley
Assistant Examiner—Chuck Y. Mah
Attorney, Agent, or Firm—LaValle D. Ptak

[57] ABSTRACT

A docking handle assembly is integrally formed from a single piece of metal for providing orthoganal movement of first and second levers. The docking handle has a set of three pivot points arranged in the form of a right triangle; and the main body portion has first and second handles extending outwardly therefrom in a mutually perpendicular arrangement, with each of the handles parallel to a different leg of the right triangle forming the pivot points. In operation, the pivot point located at the right angle of the triangle is pivotally attached to a support surface. The ends of first and second levers to be moved by the docking handle are pivotally attached to the other pivot points, respectively, for push-pull movement, as the main body portion is rotated by the handles about the pivot point attached to the underlying support surface.

17 Claims, 1 Drawing Sheet

DOCKING HANDLE

BACKGROUND

In apparatus for testing large scale integrated circuits and other components, the integrated circuits typically are mounted on a test board, with selected circuit interconnections between the pins of the integrated circuit and various input and output lines on the test board. Such test boards may be uniquely configured to test only a single integrated circuit package or configuration; or, universal test boards exist, which are operated by manipulating switches (either manually or electronically) to configure the test board for providing the inputs and outputs for the different pins of the different integrated circuits undergoing test.

Once an integrated circuit has been mounted on a test board, the test board then is placed on a test fixture, which provides the sequence of operations necessary for effecting the testing of the particular integrated circuit known as "device under test" (DUT). To ensure that the test board is properly mounted in the test apparatus for operating the various circuits, a clamp is provided on each side of the test apparatus to accurately locate and hold in place the test board during the test operation. This clamp typically is in the form of a linear cam. Usually, at least a pair of such cams are located on opposite sides of the test board on the test fixture to securely hold it in place against movement in any direction during the test operation.

To operate the linear cams for holding the test boards in place, the cams are connected by means of elongated rods or levers to a pivotal handle mechanism, known as a "docking handle", located near one of the corners of the test fixture. Frequently, a pair of docking handles are located on adjacent corners; and they are linked together by means of an elongated rod or lever. The docking handles pivot about a pivot point on the support surface of the test fixture, and are operated to slide the lever arm connected to the cams in a back-and-forth motion to engage and disengage the cams from the test board.

In the past, docking handles have been made of multiple parts, which are assembled together, along with the elongated levers to effect the operating motion required for the linear cams. The multiple parts require additional machining and expense to manufacture and assemble, and consequently, are relatively expensive. Frequently, the handles break, sometimes injuring the operator.

It is desirable to provide a docking handle which overcomes the disadvantages noted above, which is durable, easy to use, and inexpensive.

SUMMARY OF THE INVENTION

It is an object of this invention to provide an improved handle mechanism.

It is an additional object of this invention to provide an improved test fixture docking handle.

It is an another object of this invention to provide an improved docking handle to produce orthoganal movement of first and second levers.

In accordance with a preferred embodiment of this invention, a docking handle assembly causes orthoganal movement of first and second levers. The handle assembly comprises a main body portion, which has three pivot points arranged on it in a triangular pattern. One of these pivot points is pivotally attached to a support surface, and the others are pivotally attached to ends of the first and second levers, respectively. A first handle is integrally formed as a part of the main body portion of the docking handle assembly, and extends outwardly from the main body portion substantially parallel to a line drawn between two of the pivot points.

DETAILED DESCRIPTION

Figure 1:
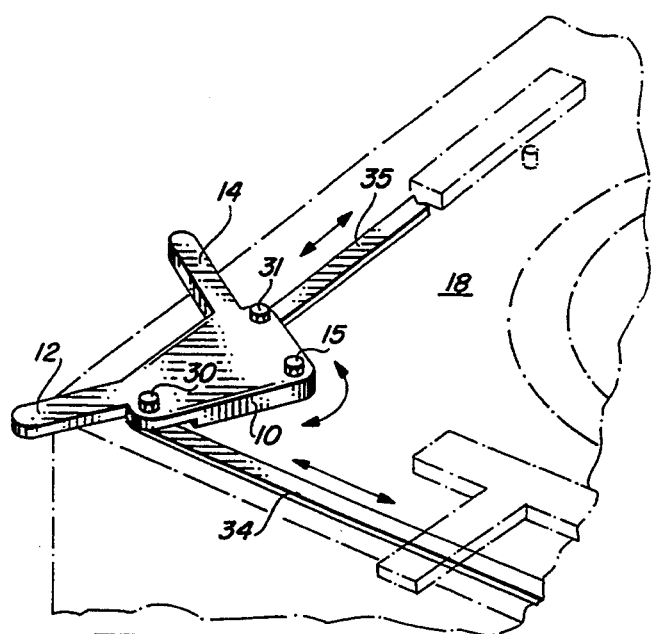
FIG. 1 is a top perspective view of a preferred embodiment of the invention illustrating its manner of use.

Reference now should be made to the drawing, in which the same reference numbers are used throughout the different figures to designate the same components. FIG. 1, is a top perspective view of the preferred embodiment of the invention. The docking handle apparatus or assembly of this invention comprises a main body portion 10, which is mounted through a pivot pin 15 on the top surface 18 of a test fixture. The test fixture itself is illustrated in dotted lines to provide an indication of the orientation of the docking handle assembly with respect to the test fixture. A standard test fixture, used in integrated circuit manufacturing and testing facilities, may be employed; and the details of the particular test fixture are not important. Such fixtures, however, typically have an upper flat support surface 18, of the type illustrated in FIG. 1. As illustrated, the docking handle assembly has a pair of outwardly extending handles 12 and 14, which extend out over the edge of the corner of the surface 18 of the test fixture. These handles are oriented at right angles to one another, as is most clearly shown in FIGS. 2 and 3. The body portion 10 and the handles 12 and 14 all are integrally formed of a single piece of material, typically aluminum, which may be machined or molded in the shape shown.

Figure 4:
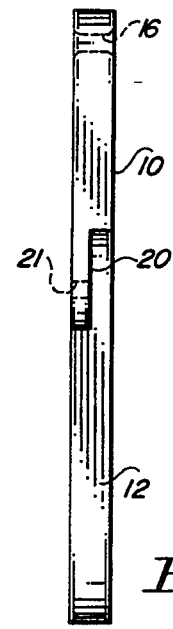
FIG. 4 is a side view of the embodiment shown in FIG. 1.

The pivot pin 15, which pivotally mounts the main body portion 10 of the docking handle assembly on the surface 18, extends through a bushing 16, which is located in the corner of the body portion 10 located opposite the two handles 12 and 14. Two other undercut regions 20 and 22 then are provided adjacent each of the handles, as illustrated most clearly in FIGS. 2, 3 and 4. The undercut areas 20 and 22 have holes 21 and 23, respectively, formed through them to receive pivot pins 30 and 31. These pins, in turn, are connected to the ends of a pair of docking levers 34 and 35, as illustrated most clearly in FIG. 1. The connection of the ends of the docking levers 34 and 35 to the pins 30 and 31 are pivotal connections to permit slight pivotal orientation of the ends of the levers 34 and 35 in the undercut areas 20 and 22, as the docking handle assembly is rocked back-and-forth in the direction of the arrow shown about the pivot pin 15 in FIG. 1.

Figure 2:
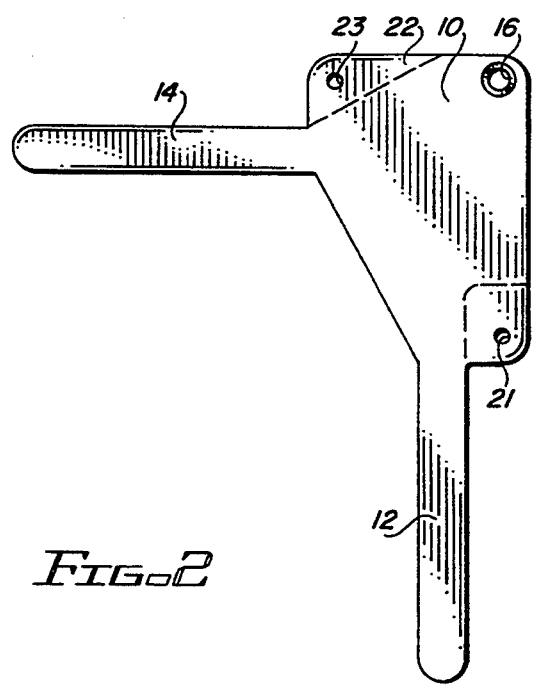
FIG. 2 is a top view of the embodiment shown in FIG. 1.
Figure 3:
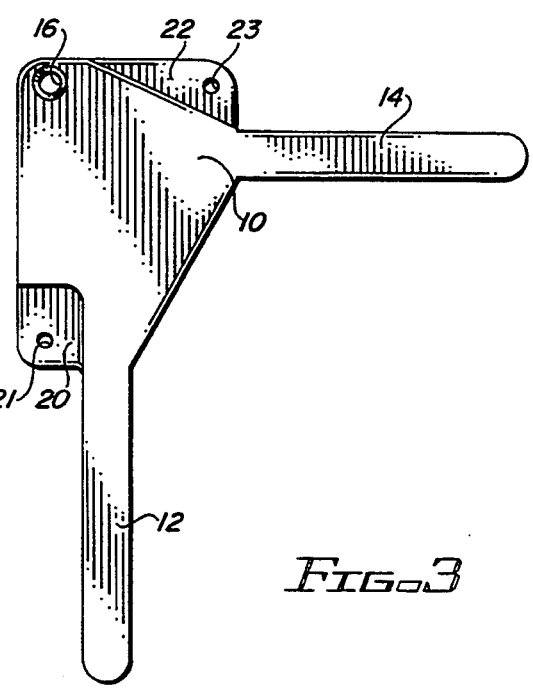
FIG. 3 is a bottom view of the embodiment shown in FIG. 1.
Figure 5:
FIG. 5 is an end view of the embodiment shown in FIG. 1.

As is most clearly shown in FIGS. 2 and 3, the holes 16, 21 and 23 are arranged in the form of a right triangular pattern, with the hole 16 located at the right angle of the triangle and the holes 21 and 23 located at the ends of the two legs of the triangle. It also should be noted, from FIGS. 2 and 3 in particular, that the distance between the holes 16 and 23 is less than the distance between the holes 16 and 21 (with the pin 31 extending through the hole 23 and the pin 30 extending through the hole 21). This configuration is employed for the test fixture shown in FIG. 1, where a pair of docking handle assemblies (only one of which is shown), which are a mirror image of one another, are located on adjacent corners of the top of the test fixture support surface 18. The elongated lever arm 34 then links together the corresponding pivots of the two docking handle assemblies while the opposite corners (corresponding to the corner provided by the hole 22 and pin 31 of FIGS. 1, 2 and 3) is connected to the end of a corresponding linear cam operating lever, such as the lever 35 shown in FIG. 1. While the distances between the central pivot 15/16 and the other pivots is not the same in the embodiment shown in FIGS. 1 through 5, an equilateral right triangle or other different relative distances could be employed, if desired.

It should be noted, in the embodiment which has been shown, that the handle 14 is parallel to a line drawn through the centers of the holes 16 and 23, and the handle 12 is parallel to a line drawn through the holes 16 and 21; so that the two handles 12 and 14 are perpendicular or orthoganal to one another. As is apparent from an examination of FIG. 1, as the docking handle assembly is rotated clockwise about the pivot 15, the elongated lever arm or rod 35 is moved upwardly (as viewed in FIG. 1) while the lever arm or rod 34 is pulled toward the left. When the docking handle assembly is rotated counterclockwise about the pin 15, the lever arm 35 is pulled downwardly and the lever arm 34 is moved toward the right, as viewed in FIG. 1. It also is apparent from an examination of FIG. 1, that these movements are perpendicular or orthogonal to one another to effect the operation of linear cams or other latching mechanism, as desired.

By fabricating the docking handle assembly, including the main body portion 10 and the handles 12 and 14, as an integral unit out of a single piece of material, the structural integrity of the assembly is enhanced. This is true whether the assembly is machined from a block of metal, such as aluminum, steel or high strength plastic, or whether the handle assembly is molded in the shape illustrated in the drawing. The particular manner of construction is not significant.

It should be noted that by providing two handles 12 and 14 at right angles to one another, both handles may be grasped by different hands of an operator to effect the rotational motion which has been described. When two hands are used, the push-pull operation of the respective lever arms 34 and 35 is made somewhat easier, since the force applied to each of the handles tends to be applied more directly to the pivot point of the adjacent lever 34 for the handle 12 and the lever 35 for the handle 14, respectively. A single handle operation may be effected; but the operation is facilitated if both handles 12 and 14 are manipulated together by different hands of the operator of the docking handle assembly.

The relative locations of the different holes 16, 21 and 23 in the main body portion 10 also may be varied in accordance with the relative amounts of linear motion which are to be imparted to the levers 34 and 35 by the docking handle. Obviously, whenever any of these holes are located more closely to the pivot 15/16, the linear motion which is effected is reduced. By the same token, when one or both of the holes are located at a greater distance from the pivot point 16, the linear motion, produced by angular rotation about the pivot point 15/16, is increased. The specific dimensions, which are employed for any particular application, are selected according to the requirements of the motion which is desired for each of the different lever arms 34 and 35.

It also should be noted that the perpendicular orientation of the handles 12 and 14, which is illustrated, is considered to be the desired orientation. Variations from this angular relationship, however, may be made to some degree, without changing the operating characteristics of the docking handle assembly. For example, the angle between the handles 12 and 14 may be less than 90°, or greater than 90°. As either of these angle variations are increased, however, a point is reached at which the effectiveness of the dual handle arrangement is substantially diminished.

The foregoing description of the preferred embodiment of the invention is to be considered as illustrative, and not as limiting. Various changes and modifications will occur to those skilled in the art, without departing from the true scope of the invention as defined in the appended claims.

We claim:

1. A docking handle apparatus for providing orthogonal movement of first and second levers including in combination:

a main body portion having three pivot points arranged thereon in a triangular pattern, with one of said pivot points adapted for pivotal attachment to a support surface and the others of said pivot points adapted for pivotal attachment to said first and second levers; and a first handle integrally formed as a part of said main body portion and extend outwardly therefrom substantially parallel to a line between two of said pivot points.

2. The combination according to claim 1 wherein said main body portion and said first handle are integrally formed from a single piece of metal.

3. The combination according to claim 2 wherein said metal is aluminum.

4. The combination according to claim 3 wherein said pivot points comprise first, second and third pivot points, respectively, with said first pivot point being adapted for pivotal attachment to said support surface, said second pivot point being adapted for pivotal attachment to said first lever, and said third pivot point being adapted for pivotal attachment to said second lever.

5. The combination according to claim 4 wherein said line extends between said first pivot point and one of said second and third pivot points.

6. The combination according to claim 5 wherein said triangular pattern is a right triangle pattern.

7. The combination according to claim 6 further including a second handle integrally formed as part of said main body portion and extending outwardly therefrom, said first handle extending substantially parallel to a line between said first and second pivot points and said second handle extending outwardly from said main body portion substantially parallel to a line between said first and third pivot points.

8. The combination according to claim 7 wherein said main body portion and said first and second handles are integrally formed from a single piece of metal.

9. The combination according to claim 8 wherein said first and second handles are perpendicular to one another and extend outwardly from said main body portion on a side forming the hypotenuse of said right triangle pattern of said pivot points.

10. The combination according to claim 1 wherein said triangular pattern is a right triangle pattern.

11. The combination according to claim 10 wherein said pivot points comprise first, second and third pivot points, respectively, with said first pivot point being adapted for pivotal attachment to said support surface, said second pivot point being adapted for pivotal attachment to said first lever, and said third pivot point being adapted for pivotal attachment to said second lever.

12. The combination according to claim 11 further including a second handle integrally formed as part of said main body portion and extending outwardly therefrom, said first handle extending substantially parallel to a line between said first and second pivot points and said second handle extending outwardly from said main body portion substantially parallel to a line between said first and third pivot points.

13. The combination according to claim 12 wherein said first and second handles are perpendicular to one another and extend outwardly from said main body portion on a side forming the hypotenuse of said right triangle pattern of said pivot points.

14. The combination according to claim 13 wherein said main body portion and said first and second handles are integrally formed from a single piece of metal.

15. The combination according to claim 1 wherein said pivot points comprise first, second and third pivot points, respectively, with said first pivot point being adapted for pivotal attachment to said support surface, said second pivot point being adapted for pivotal attachment to said first lever, and said third pivot point being adapted for pivotal attachment to said second lever.

16. The combination according to claim 15 wherein said line extends between said first pivot point and one of said second and third pivot points.

17. The combination according to claim 16 further including a second handle integrally formed as part of said main body portion and extending outwardly therefrom, said first handle extending substantially parallel to a line between said first and second pivot points and said second handle extending outwardly from said main body portion substantially parallel to a line between said first and third pivot points.

* * * * *